US008582272B2

(12) United States Patent
Tang

(10) Patent No.: US 8,582,272 B2
(45) Date of Patent: Nov. 12, 2013

(54) PROTECTION CIRCUIT FOR PROTECTING LIGHT-EMITTING DIODES OF LASER EMITTER AND PROTECTION METHOD

(75) Inventor: Xing-Hua Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 63 days.

(21) Appl. No.: 13/454,024

(22) Filed: Apr. 23, 2012

(65) Prior Publication Data

US 2013/0250989 A1  Sep. 26, 2013

(30) Foreign Application Priority Data

Mar. 23, 2012 (CN) .......................... 2012 1 0079585

(51) Int. Cl.
*H02H 3/22* (2006.01)
(52) U.S. Cl.
USPC .......................................................... 361/118
(58) Field of Classification Search
USPC .......................................................... 361/118
See application file for complete search history.

(56) References Cited

U.S. PATENT DOCUMENTS

| | | | | |
|---|---|---|---|---|
| 4,745,610 A | * | 5/1988 | Yoshikawa | 372/38.02 |
| 5,038,133 A | * | 8/1991 | Martin | 340/438 |
| 7,390,115 B1 | * | 6/2008 | Huang et al. | 362/542 |
| 8,493,000 B2 | * | 7/2013 | Jungwirth | 315/307 |
| 2009/0323238 A1 | * | 12/2009 | Gehrke | 361/56 |
| 2010/0079076 A1 | * | 4/2010 | Chang et al. | 315/187 |
| 2010/0079086 A1 | * | 4/2010 | Chang | 315/294 |
| 2011/0012137 A1 | * | 1/2011 | Lin et al. | 257/88 |
| 2011/0057569 A1 | * | 3/2011 | Wei et al. | 315/122 |
| 2011/0163682 A1 | * | 7/2011 | Jungwirth | 315/192 |

* cited by examiner

*Primary Examiner* — Ronald W Leja
(74) *Attorney, Agent, or Firm* — Altis & Wispro Law Group, Inc.

(57) ABSTRACT

A protection circuit for protecting light-emitting diodes of a laser emitter is provided. The laser emitter includes a first LED for reading multimedia data stored in a first media and a second LED for reading multimedia data stored in a second media. Cathodes of the first LED and the second LED are grounded, and anodes of the first LED and the second LED are connected with soldering tin. The protection circuit includes a first protection element with a first breakdown voltage and a second protection element with a second breakdown voltage. One end of each of the first protection element and the second protection element is grounded. When the circuit is connected to the laser emitter, residual ends of the first protection element and the second protection element are respectively connected to the anodes of the first LED and the second LED.

7 Claims, 5 Drawing Sheets

PROTECTION CIRCUIT FOR PROTECTING LIGHT-EMITTING DIODES OF LASER EMITTER AND PROTECTION METHOD

BACKGROUND

1. Technical Field

The present disclosure relates to laser emitters and, more particularly, to a protection circuit for protecting light-emitting diodes of a laser emitter and a protection method.

2. Description of Related Art

Electronic devices, such as video compact disc (VCD) players or digital video disc (DVD) players which have a function of playing multimedia data stored in a disc, include laser emitters. Each laser emitter includes at least one light-emitting diode (LED) for reading multimedia data stored in a DVD/VCD. However, the LED for reading multimedia data is easily damaged because of electrostatic interaction.

Referring to FIG. 1, generally speaking, a DVD player (not shown) can read the multimedia data stored in a DVD, as well as read the multimedia data stored in a VCD. The laser emitter 100 of the DVD player includes a first LED 10 for reading multimedia data stored in the DVD and a second LED 20 for reading multimedia data stored in the VCD. After the laser emitter 100 is produced, the cathodes of the first LED 10 and the second LED 20 are grounded. Before the laser emitter 10 is entirely mounted to an electronic device, in order to not damage the first LED 10 and the second LED 20 by electrostatic interaction, the anodes of the first LED 10 and the second LED 20 are connected by soldering tin 30. When the laser emitter 100 is mounted to an electronic device, the soldering tin 30 is removed (using a tool such as a hot searing-iron) to disconnect the connection between the anode of the first LED 10 and the anode of the second LED 20 to enable the first LED 10 and the second LED 20 to work. However, when removing the soldering tin 30, static electricity around the first LED 10, the second LED 20, and the tool may damage the first LED 10 or the second LED 20, and further damage the laser emitter.

BRIEF DESCRIPTION OF THE DRAWINGS

The components in the drawing are not necessarily drawn to scale, the emphasis instead being placed upon clearly illustrating the principles of the present disclosure.

DETAILED DESCRIPTION

The disclosure is illustrated by way of example and not by way of limitation. It should be noted that references to "an" or "one" embodiment in this disclosure are not necessarily to the same embodiment, and such references mean at least one.

Figure 1:
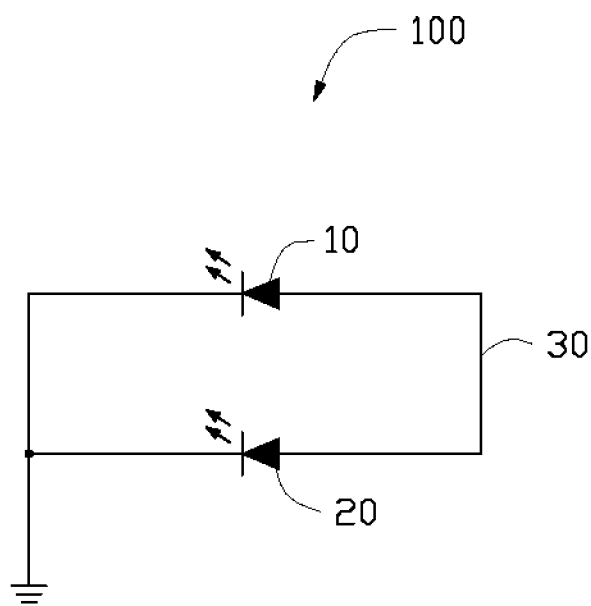
FIG. 1 is a schematic view showing a conventional protection technology for protecting a first LED and a second LED of a laser emitter before the laser emitter is mounted into an electronic device.
Figure 2:
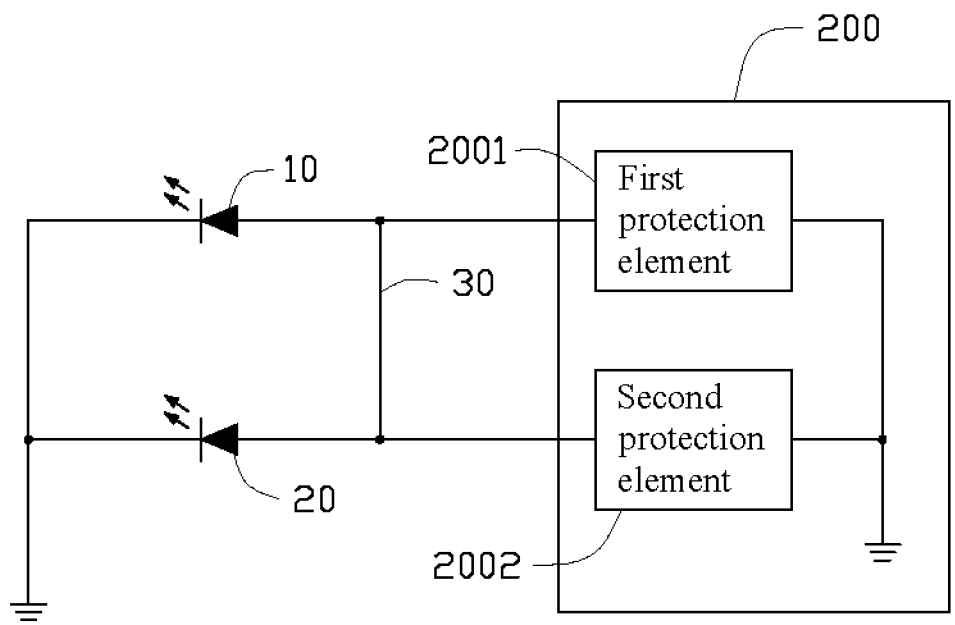
FIG. 2 is a schematic view showing a protection circuit for protecting the first LED and the second LED of the laser emitter of FIG. 1, when removing soldering tin between an anode of the first LED and an anode of the second LED, in accordance with an exemplary embodiment.

FIG. 2 shows a protection circuit 200 for protecting LEDs 10 and 20 of a laser emitter 100. The first LED 10 reads multimedia data stored in a media, such as a VCD/DVD. The second LED 20 reads multimedia data stored in a media, such as a VCD/DVD. The cathodes of the first LED 10 and the second LED 20 are grounded, and the anodes of the first LED 10 and the second LED 20 are connected with soldering tin 30 to avoid damage to the first LED 10 and the second LED 20 by electrostatic interaction.

The protection circuit 200 protects the first LED 10 and the second LED 20 from being damaged by electrostatic interaction when the soldering tin 30 is removed to disconnect the connection between the anode of the first LED 10 and the anode of the second LED 20. The protection circuit 200 includes a first protection element 2001 with a first breakdown voltage and a second protection element 2002 with a second breakdown voltage. One end of the first protection element 2001 and the second protection element 2002 are both grounded. When the protection circuit 200 is connected to the laser emitter 100, a residual end of the first protection element 2001 is connected to the anode of the first LED 10, and a residual end of the second protection element 2002 is connected to the anode of the second LED 20.

When the voltage between the soldering tin 30 and ground is greater than or equal to the first breakdown voltage or the second breakdown voltage, the protection circuit 200 is turned on to cause the anodes of the first LED 10 and the second LED 20 to be grounded, thus preventing the LEDs 10 and 20 from being damaged when the soldering tin 30 is removed.

In another embodiment, the protection circuit 200 includes only one protection element with a breakdown voltage. One end of the protection element is grounded. When the protection circuit 200 is connected to the laser emitter 100, a residual end of the protection element is connected to the soldering tin 30.

Figure 3:
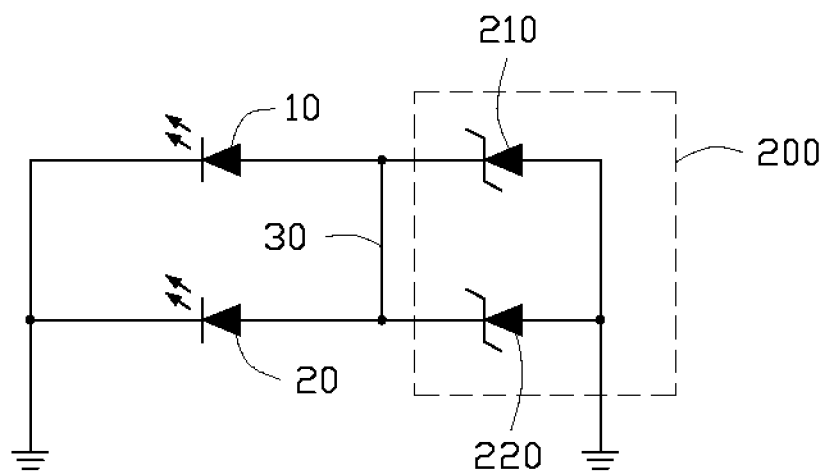
FIG. 3 is a circuit diagram of the protection circuit of FIG. 2 in accordance with a first exemplary embodiment.

FIG. 3 shows a circuit diagram of the protection circuit 200 in accordance with a first exemplary embodiment. The protection circuit 200 includes a first zener diode 210 and a second zener diode 220, grounding the anodes of the first zener diode 210 and the second zener diode 220. When the protection circuit 200 is connected to the laser emitter 100, the cathode of the first zener diode 210 is connected to the anode of the first LED 10, and the cathode of the second zener diode 220 is connected to the anode of the second LED 20.

Figure 4:
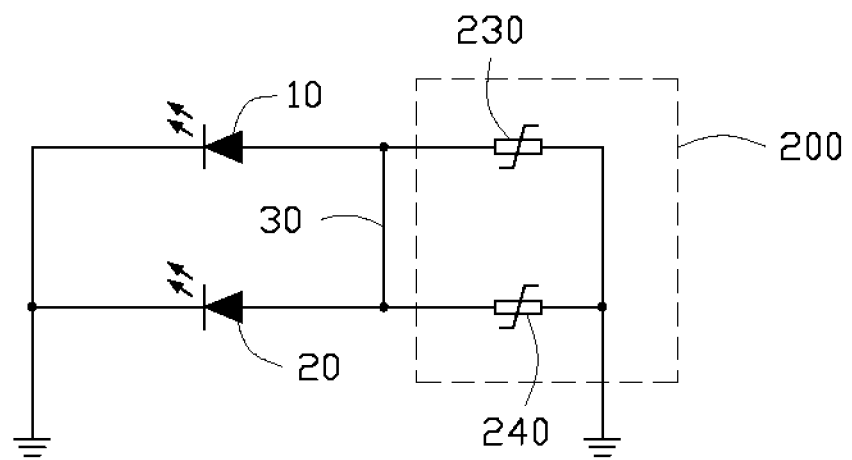
FIG. 4 is a circuit diagram of the protection circuit of FIG. 2 in accordance with a second exemplary embodiment.

FIG. 4 shows a circuit diagram of the protection circuit 200 in accordance with a second exemplary embodiment. The protection circuit 200 includes a first Voltage Dependent Resistor (VDR) 230 and a second Voltage Dependent Resistor (VDR) 240. The first VDR 230 and the second VDR may be multi-layer varistors (MLU).

Figure 5:
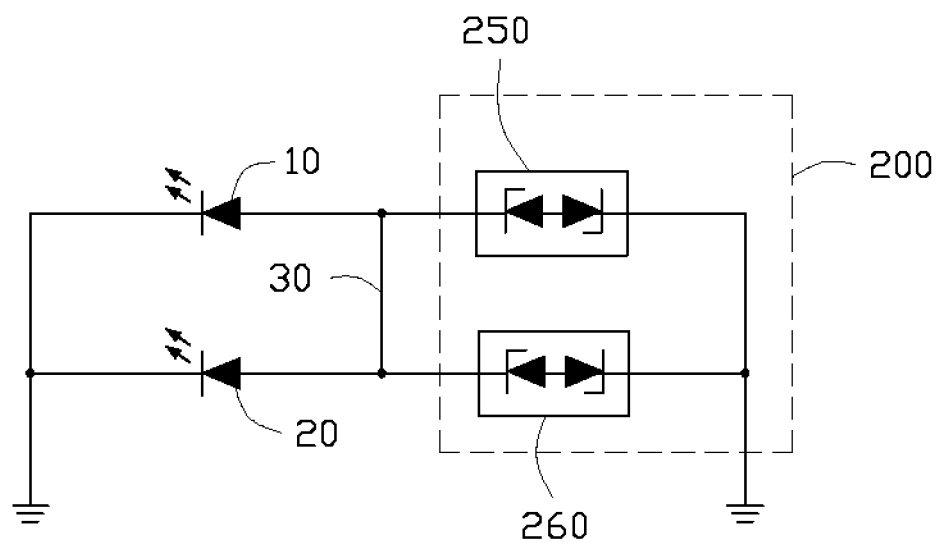
FIG. 5 is a circuit diagram of the protection circuit of FIG. 2 in accordance with a third exemplary embodiment.

FIG. 5 shows a circuit diagram of the protection circuit 200 in accordance with a third exemplary embodiment. The protection circuit 200 includes a first Transient Voltage Suppressor (TVS) 250 and a second Transient Voltage Suppressor (TVS) 260.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A protection circuit for protecting light-emitting diodes of a laser emitter, the laser emitter comprising a first light-emitting diode for reading multimedia data stored in a first media and a second light-emitting diode for reading multimedia data stored in a second media, cathodes of the first light-emitting diode and the second light-emitting diode being grounded, anodes of the first light-emitting diode and the second light-emitting diode being connected with soldering tin, the protection circuit comprising:

a first protection element with a first breakdown voltage, a first end of the first protection element being grounded; and a second protection element with a second breakdown voltage, a first end of the second protection element being grounded;

wherein when the overvoltage protection circuit is connected to the laser emitter, a second end of the first protection element is connected to the anode of the first light-emitting diode, and a second end of the second protection element is connected to the anode of the second light-emitting diode.

2. The protection circuit as described in claim 1, wherein when a voltage between the soldering tin and ground is greater than or equal to the first breakdown voltage or the second breakdown voltage, the protection circuit is turned on to cause the anodes of the first light-emitting diode and the second light-emitting diode to be grounded.

3. The protection circuit as described in claim 2, wherein the first protection element is a first zener diode, the second protection element is a second zener diode, anodes of the first zener diode and the second zener diode are grounded, when the protection circuit is connected to the laser emitter, a cathode of the first zener diode is connected to the anode of the first light-emitting diode, and a cathode of the second zener diode is connected to the anode of the second light-emitting diode.

4. The protection circuit as described in claim 2, wherein the first protection element and the second protection element are voltage dependent resistors.

5. The protection circuit as described in claim 2, wherein the first protection element and the second protection element are transient voltage suppressors.

6. The protection circuit as described in claim 2, wherein the first media is a DVD, and the second media is a VCD.

7. A protection circuit for protecting light-emitting diodes of a laser emitter, the laser emitter comprising a first light-emitting diode for reading multimedia data stored in a first media and a second light-emitting diode for reading multimedia data stored in a second media, cathodes of the first light-emitting diode and the second light-emitting diode being grounded, anodes of the first light-emitting diode and the second light-emitting diode being connected with soldering tin, the protection circuit comprising:

a protection element with a breakdown voltage, a first end of the protection element being grounded;

wherein when the overvoltage protection circuit is connected to the laser emitter, a second end of the protection element is connected to the soldering tin.

* * * * *